(12) United States Patent
Asano

(10) Patent No.: US 7,977,873 B2
(45) Date of Patent: Jul. 12, 2011

(54) ELECTROLUMINESCENT DEVICE HAVING PROTECTIVE LAYERS FOR SEALING

(75) Inventor: Motohiko Asano, Yasu (JP)

(73) Assignee: Kyocera Corporation, Kyoto (JP)

( * ) Notice: Subject to any disclaimer, the term of this patent is extended or adjusted under 35 U.S.C. 154(b) by 364 days.

(21) Appl. No.: 12/223,405

(22) PCT Filed: Jan. 29, 2007

(86) PCT No.: PCT/JP2007/051402
§ 371 (c)(1),
(2), (4) Date: Jul. 30, 2008

(87) PCT Pub. No.: WO2007/088813
PCT Pub. Date: Aug. 9, 2007

(65) Prior Publication Data
US 2009/0015153 A1    Jan. 15, 2009

(30) Foreign Application Priority Data

Jan. 31, 2006  (JP) ................................. 2006-023245
Jul. 24, 2006  (JP) ................................. 2006-200682

(51) Int. Cl.
*H05B 33/04* (2006.01)
*H01J 1/62* (2006.01)

(52) U.S. Cl. .......... 313/506; 313/504; 313/512; 445/24; 445/25; 257/79

(58) Field of Classification Search ........... 313/504–512
See application file for complete search history.

(56) References Cited

U.S. PATENT DOCUMENTS

| 2002/0158568 A1 | 10/2002 | Satake |
| 2002/0180371 A1 | 12/2002 | Yamazaki et al. |
| 2003/0010283 A1 | 1/2003 | Yamazaki et al. |
| 2003/0127651 A1* | 7/2003 | Murakami et al. ............... 257/72 |
| 2003/0168966 A1 | 9/2003 | Kobayashi et al. |
| 2004/0079950 A1* | 4/2004 | Takayama et al. ............... 257/79 |
| 2004/0124770 A1 | 7/2004 | Hayashi et al. |
| 2004/0178725 A1 | 9/2004 | Karasawa et al. |
| 2004/0239827 A1* | 12/2004 | Yamazaki et al. ............... 349/45 |
| 2006/0208632 A1* | 9/2006 | Kang ............................ 313/503 |

FOREIGN PATENT DOCUMENTS

| EP | 1643811 A1 * | 4/2006 |
| JP | 2002-324662 A | 11/2002 |
| JP | 2002-324666 A | 11/2002 |
| JP | 2002-352950 A | 12/2002 |
| JP | 2002-370352 A | 12/2002 |
| JP | 2004-146244 A | 5/2004 |
| JP | 2004-228024 A | 8/2004 |
| JP | 2005-235790 A | 9/2005 |
| JP | 2005-267984 A | 9/2005 |
| JP | 2005-301020 A | 10/2005 |
| WO | WO-03/060858 A1 | 7/2003 |

* cited by examiner

*Primary Examiner* — Sikha Roy
(74) *Attorney, Agent, or Firm* — Birch, Stewart, Kolasch & Birch, LLP.

(57) ABSTRACT

An EL device includes a substrate; a first electrode layer; an insulating layer having an opening corresponding to a pixel; a first protective layer covering the insulating layer; an organic layer on the first protective layer and the first electrode layer in the opening; a second electrode layer on the organic layer; and a second protective layer on the second electrode layer, wherein the second protective layer covers edges of the organic layer and the second electrode layer and extends to the outside of the forming region of the organic layer and the second electrode layer to contact the first protective layer.

13 Claims, 9 Drawing Sheets

ELECTROLUMINESCENT DEVICE HAVING PROTECTIVE LAYERS FOR SEALING

BACKGROUND OF THE INVENTION

1. Field of the Invention

The present invention relates to an electroluminescent (EL) device such as an organic EL display.

2. Description of the Related Art

Japanese Unexamined Patent Application Publication Nos. 2004-228034 (document '034) and 2005-301020 (document '020) disclose techniques related to EL devices. The EL device disclosed in document '034 includes an element portion in which an anode (104), organic electroluminescent device pixels (102) and a cathode (105) are stacked, and ribs (103) on a substrate (101). A protective film (106) covers the element portion and the ribs (103).

In the EL device disclosed in document '020, a cathode (34) is provided on the upper surface of an organic EL layer (32), a projecting resin layer (26) and a barrier insulating layer (28) are provided on a side surface of the organic EL layer (32), and a protective film (31) is provided on the lower surface of the organic EL layer (32) with an anode (30) between the protective film (31) and the organic EL layer (32).

In the EL device disclosed in document '034, the organic electroluminescent device pixels (102) are covered with the anode (104), the cathode (105), and the protective film (106). However, according to this structure, in the outer periphery of the organic electroluminescent device pixels (102), if the cathode (105) is formed at a position shifted from a predetermined position, the cathode (105) may be in contact with the anode (104), thereby a short circuit may occur.

In the EL device disclosed in document '020, a short circuit between the positive electrode (30) and the cathode (34) is prevented by the presence of the barrier insulating layer (28). However, since the projecting resin layer (26), which relatively easily allows moisture and the like to pass, is provided between adjacent organic EL layers (32), the seal of the organic EL layer (32) in each pixels may not be sufficiently strong. More specifically, if the seal of any pixel is broken for some reason, moisture and the like may intrude into the organic EL layer (32) in the pixel whose seal has been broken.

The present invention has been conceived in order to solve the above problems. An object of the present invention is to satisfactorily maintain sealability of an organic layer.

SUMMARY OF THE INVENTION

To solve the above problems, according to one aspect of the present invention, an EL device includes a substrate; a first electrode layer on the substrate; an insulating layer which is provided on the first electrode layer, which includes an organic material, and which has an opening corresponding to a pixel; a first protective layer covering the insulating layer; an organic layer on the first protective layer and the first electrode layer in the opening and which includes a light-emitting layer; a second electrode layer on the organic layer; and a second protective layer on the second electrode layer. In the EL device, the second protective layer covers edges of the organic layer and the second electrode layer and extends to the outside of the region where the organic layer and the second electrode layer are formed so as to contact the first protective layer.

ADVANTAGES

According to one aspect of the present invention, by satisfactorily surrounding the organic layer with the first protective layer, the second protective layer, the first electrode layer, and the second electrode layer, the seal of the organic layer can be effectively maintained.

DESCRIPTION OF THE PREFERRED EMBODIMENTS

Figure 1:
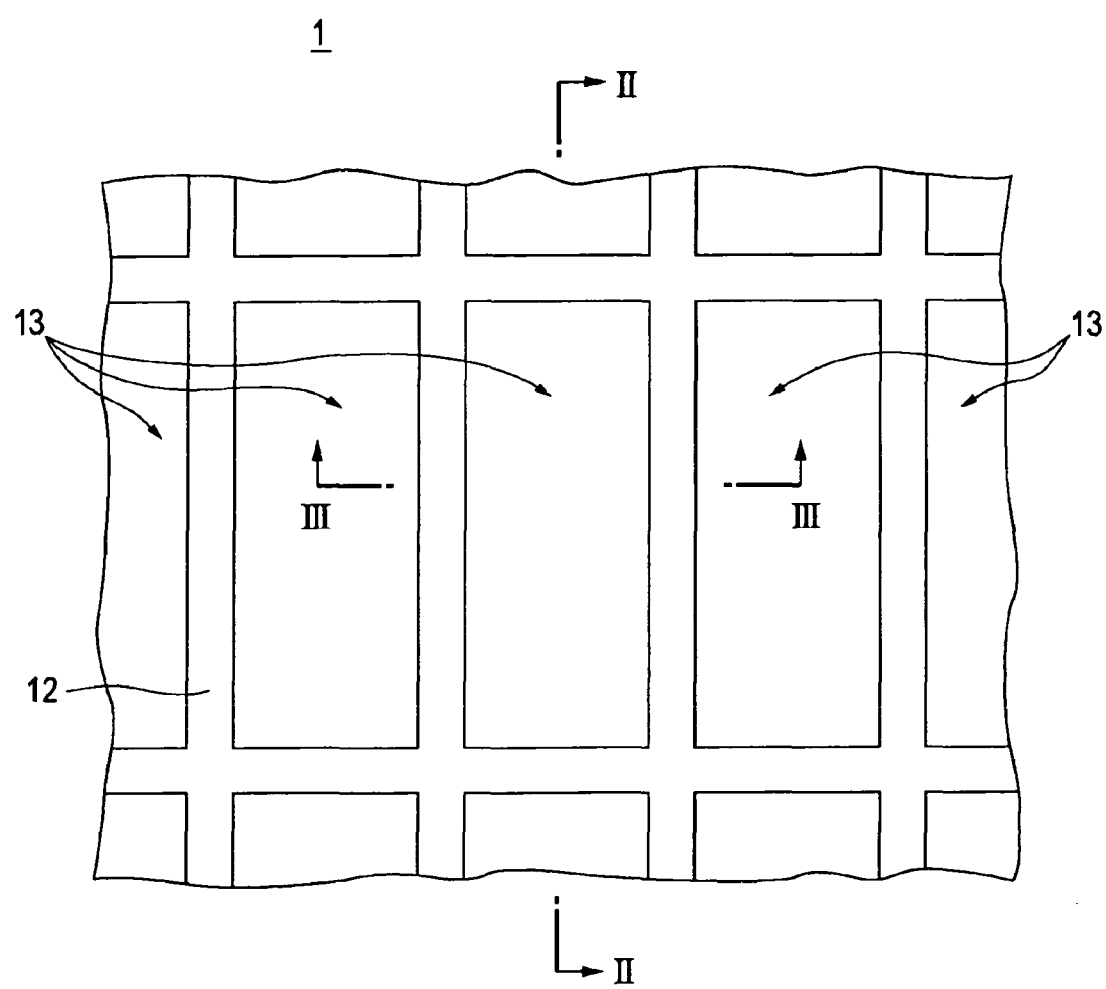
FIG. 1 is a plan view of an EL device according to one embodiment of the present invention.
Figure 2:
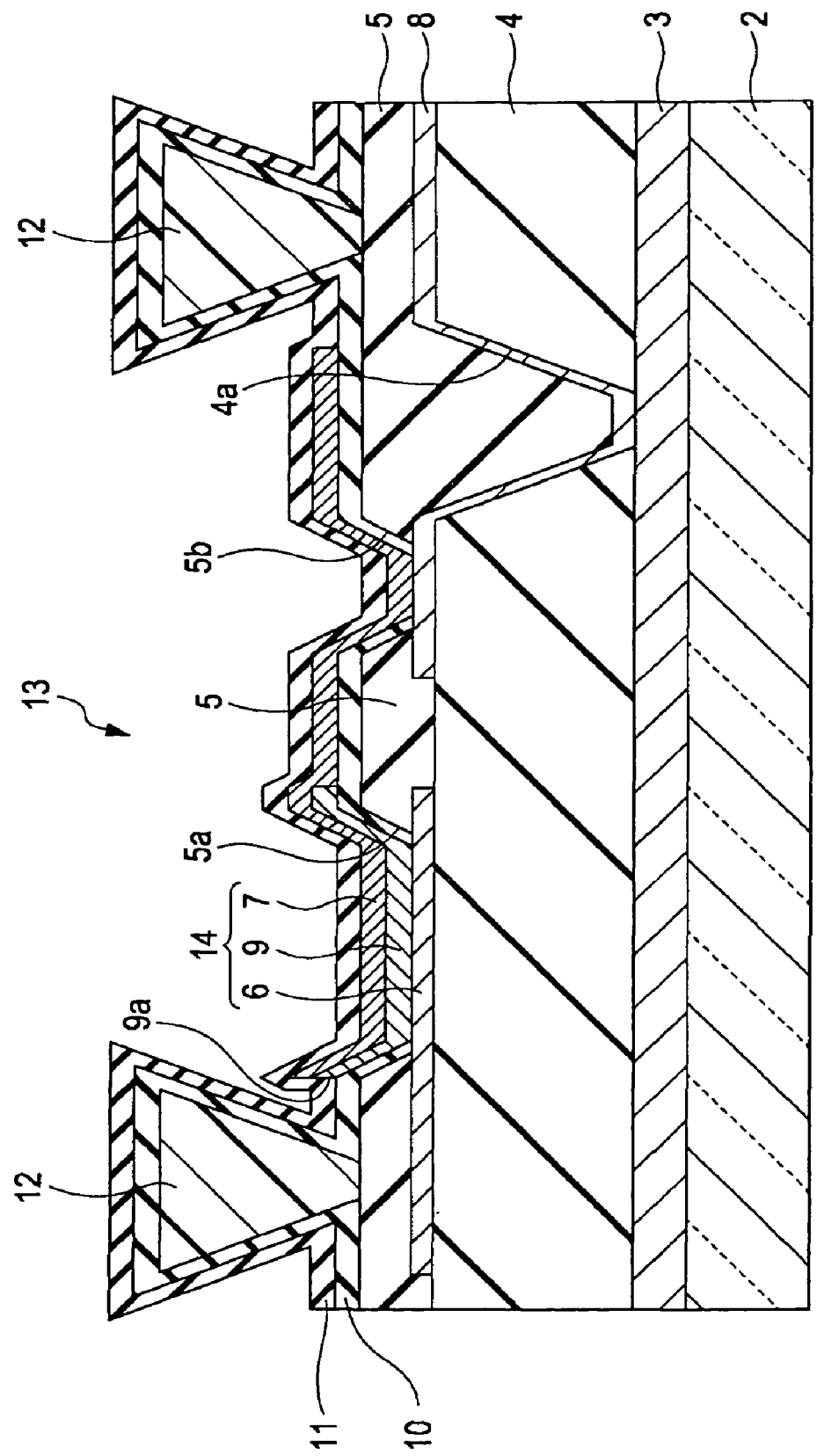
FIG. 2 is a cross-sectional view taken along line II-II of FIG. 1.

FIG. 1 is a plan view of an EL device according to one embodiment of the present invention. FIG. 2 is a cross-sectional view taken along line II-II of FIG. 1, and FIG. 3 is a cross-sectional view taken along line III-III of FIG. 1.

Figure 3:
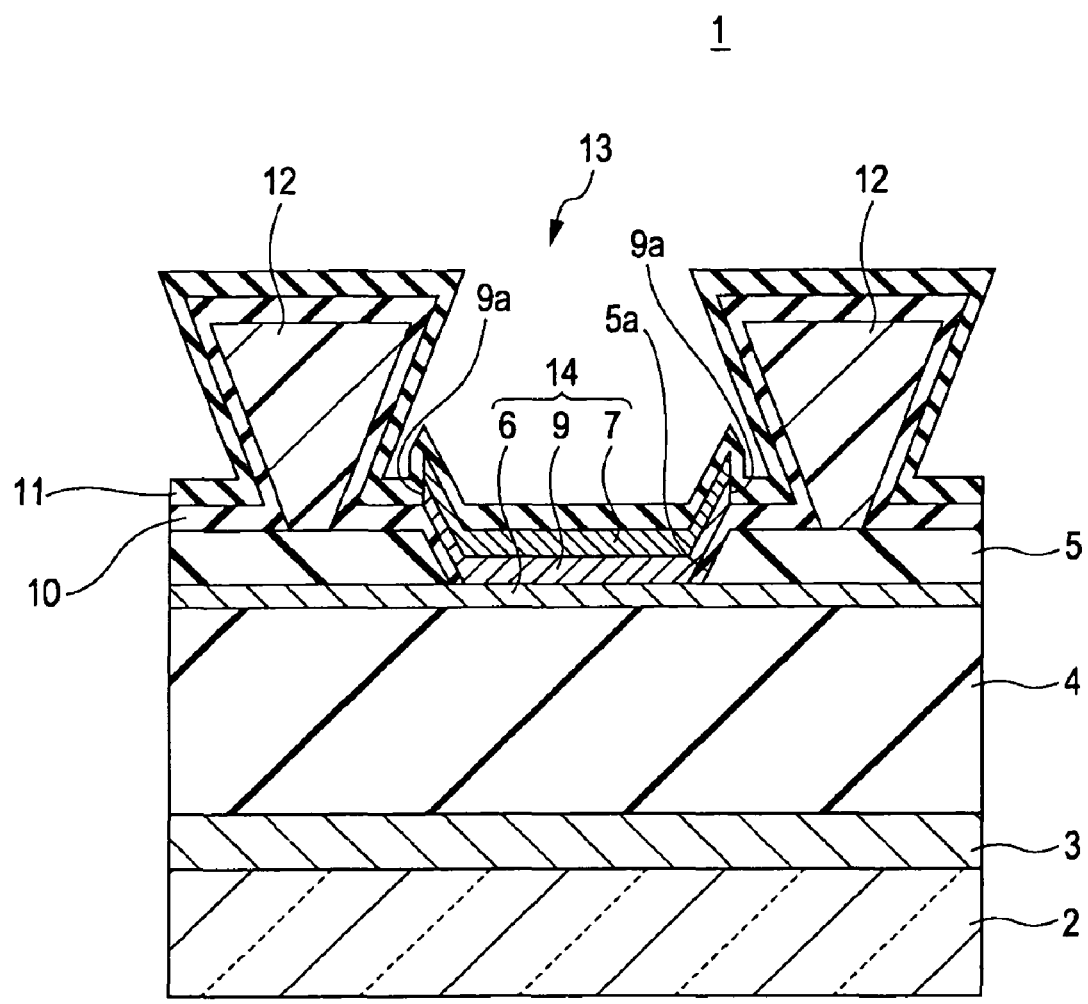
FIG. 3 is a cross-sectional view taken along line III-III of FIG. 1.

As shown in FIGS. 1 to 3, an EL device 1 in accordance with this embodiment includes a substrate 2, a circuit layer 3, a first insulating layer 4, a second insulating layer 5, a first electrode layer 6, a second electrode layer 7, a conductive layer 8, an organic layer 9, a first protective layer 10, a second protective layer 11, and a partition wall 12. A plurality of pixel regions 13 are provided on the upper surface side of the substrate 2. An organic light-emitting element 14 including the first electrode layer 6, the organic layer 9 and the second electrode layer 7 is provided in each of the pixel regions 13. The partition wall 12 is arranged in a grid pattern so as to separate the pixel regions 13. The pixel regions 13 are arranged on the substrate 2 in a matrix shape having a plurality of rows and a plurality of columns.

Figure 9A:
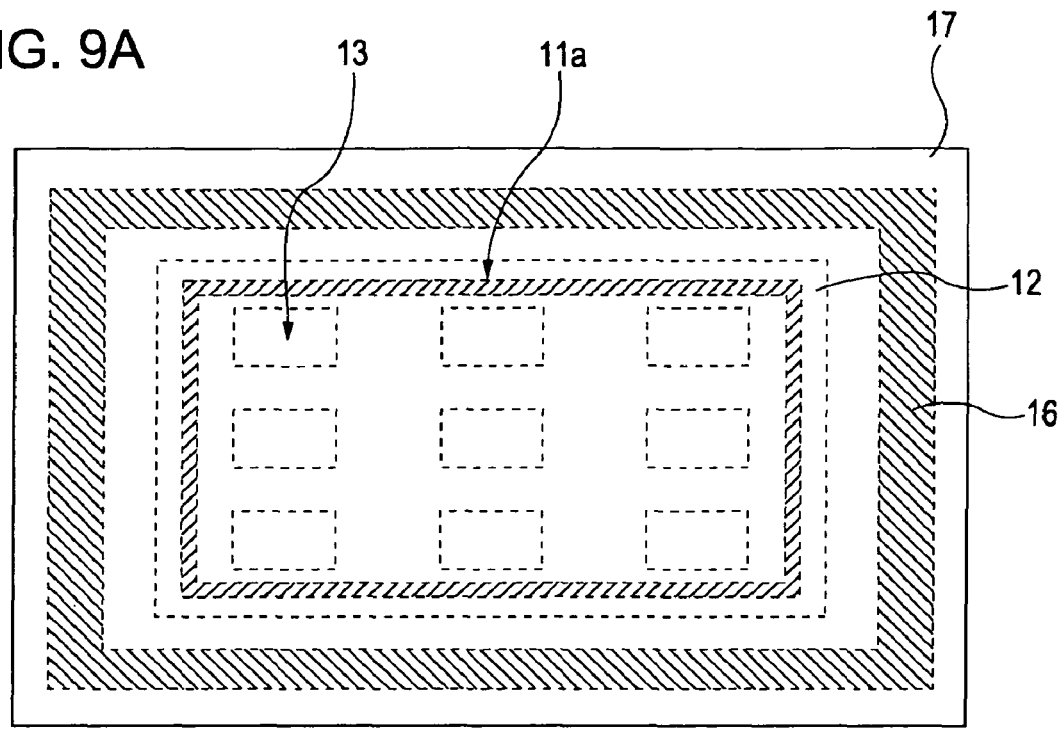
FIG. 9A is a plan view showing an EL device according to one embodiment of the present invention.
Figure 9B:
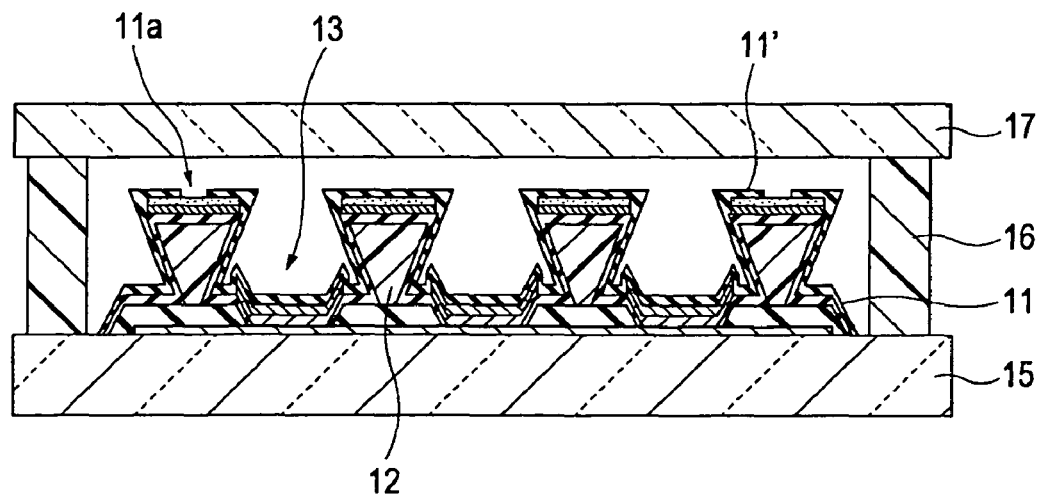
FIG. 9B is a cross-sectional view showing the EL device according to one embodiment of the present invention.

As shown in FIGS. 9A and 9B, a substrate including a substrate 2, a circuit layer 3 and a first insulating layer 4 is referred to as "element substrate 15". Pixel regions 13 arranged on the element substrate 15 in a matrix shape is sealed with a sealing substrate 17 using a sealing material 16 provided on the element substrate 15. The sealing material 16 may include, for example, an acrylic resin, an epoxy resin, a urethane resin, or a silicone resin.

This EL device 1 has a top-emission structure in which light emitted from the organic layer 9 is extracted to the outside through, for example, the second electrode layer 7 and the second protective layer 11, which are provided on the upper surface side of the organic layer 9. The EL device 1 has a structure corresponding to an active matrix. Alternatively, a structure corresponding to a passive matrix may be used. Either the first electrode layer 6 or the second electrode layer 7 may be used as the anode side. In addition, regarding which of the first electrode layer 6 or the second electrode layer 7 is used as a common electrode, either the first electrode layers 6 or the second electrode layers 7 in adjacent pixel regions 13 may be electrically connected to each other to form a common electrode.

Each of the substrate 2 and the sealing substrate 17 includes a glass substrate or the like. The circuit layer 3 constitutes a part of a thin-film transistor or a capacitive element (not shown). The first insulating layer 4 insulates between the circuit layer 3 and the organic light-emitting element 14 so as to insulate the circuit layer 3 and the organic light-emitting element 14 each other. The first insulating layer 4 includes, for example, an inorganic material such as a silicon oxide (SiO, SiNO, or $SiO_2$) or a silicon nitride ($Si_3N_4$ or $SiN_x$) having an insulating property or an organic material such as an resin having an insulating property.

The first electrode layer 6 is provided on the first insulating layer 4 and constitutes a lower electrode of the organic light-emitting element 14. The conductive layer 8 electrically connects the second electrode layer 7 to the circuit layer 3. The conductive layer 8 is disposed at a position on the first insulating layer 4, the position being separated from the first electrode layer 6. A part of the conductive layer 8 is electrically connected to the circuit layer 3 via a contact hole 4a provided through the first insulating layer 4. The second insulating layer 5 including a resin is provided on the first electrode layer 6 and the conductive layer 8, and the second insulating layer 5 include openings 5a and 5b corresponding to each of the pixel regions 13. The organic layer 9 and the second electrode layer 7 are sequentially stacked in the opening 5a to form the organic light-emitting element 14. The opening 5b electrically connects the second electrode layer 7 to the conductive layer 8.

The partition wall 12 includes an insulating resin, and the cross-sectional shape of the partition wall 12 has a substantially reverse-tapered shape in which the upper width is larger than the lower width. In this embodiment, the partition wall 12 is provided on the second insulating layer 5. Each of the partition wall 12 and the second insulating layer 5 includes a resin, satisfactory adhesiveness can be achieved between the partition wall 12 and the second insulating layer 5. Each of the pixel regions 13 separated by the partition wall 12 has a substantially rectangular planar shape.

The first protective layer 10 includes an inorganic material such as a silicon oxide film or a silicon nitride film having sealability for moisture, gas and the like. The first protective layer 10 is formed on the partition wall 12 and the second insulating layer 5 by, for example, chemical vapor deposition (CVD) so as to cover the surface thereof. The openings 5a and 5b are formed by etching or the like. The inner peripheries of the openings 5a and 5b in the first protective layer 10 are closely in contact with the surfaces of the first electrode layer 6 and the conductive layer 8 in such a manner that the edges of the second insulating layer 5 are not exposed in the inner peripheries of the openings 5a and 5b.

The organic layer 9 includes a light-emitting layer containing an organic material as a light emitter. The organic layer 9 is bonded on the first protective layer 10 and on the first electrode layer 6 in the opening 5a. In this embodiment, the lower surface at the substantially central portion of the organic layer 9 is located in the opening 5a and is in close contact with the first electrode layer 6. The lower surfaces at the outer edges of the organic layer 9 are disposed so as to cover the first protective layer 10 at the periphery of the opening 5a, and thus, in close contact with the first protective layer 10. Accordingly, the organic layer 9 is not in contact with the second insulating layer 5.

The organic layer 9 may have a single-layer structure or a multilayered structure in which a plurality of layers having different functions are stacked. For example, in the case where the organic layer 9 has a single-layer structure composed of only a light-emitting layer, the light-emitting layer may include a material having both a hole-transporting property and an electron-transporting property, and a light-emitting material may be doped in the material. Alternatively, in the case where the organic layer 9 has a single-layer structure, a light-emitting material which also has a charge-transporting property may be used. In such a single-layer structure, the process of forming an element can be simplified to improve the yield. Accordingly, such a single-layer structure can advantageously provide an EL device 1 that can be produced at a low cost.

In the case where a multilayered structure is used as the structure of the organic layer 9, for example, in addition to a light-emitting layer, among a hole-transporting layer, a hole-injecting layer, a hole-blocking layer, an electron-transporting layer, an electron-injecting layer, and an electron-blocking layer, one or a plurality of layers are selected to form the organic layer 9. For example, when the organic layer 9 has a multilayered structure including a light-emitting layer and a hole-blocking layer, in order to control the amount of injection of electric charges from the first electrode layer 6 and the second electrode layer 7, the hole-blocking layer may be provided between an electron-transporting layer and one of the first electrode layer 6 and the second electrode layer 7 functioning as a hole-injecting electrode. Similarly, an electron-blocking layer may be provided between the hole-transporting layer and the other of the first electrode layer 6 and the second electrode layer 7 functioning as an electron-injecting electrode. Although an inorganic material may be used as the hole-injecting layer or the electron-injecting layer, such layers are commonly referred to as "organic layers".

The second electrode layer 7 is provided on the organic layer 9 using a conductive material having optical transparency, such as an indium tin oxide (ITO) film or a tin oxide film, in order to extract light from the upper surface side of the organic layer 9. Alternatively, even when the second electrode layer 7 is made of a material that basically does not have optical transparency, such as magnesium, silver, or aluminum, the second electrode having the small thickness of 100 nm or less enables light to transmit through the second electrode layer 7, while ensuring the conductivity to some degree.

The second electrode layer 7 is provided so as to extend from the organic layer 9 in each of the pixel regions 13 to the opening 5b. A part of the second electrode layer 7 is electrically connected to the conductive layer 8 via the opening 5b.

The second protective layer 11 includes an inorganic material such as a silicon oxide film or a silicon nitride film. The second protective layer 11 seals the organic layer 9 and the second electrode layer 7 and protects these layers from moisture and outside air. The second protective layer 11 is formed by CVD or the like not only on the second electrode layer 7 but also so as to cover the entire area where the pixel regions 13 are provided on the upper surface side of the substrate 2, the area including, for example, the end faces of the second electrode layer 7, the first protective layer 10, and the partition wall 12.

According to the above structure, the upper surface, the lower surface, and end faces of the organic layer 9 are surrounded by the first protective layer 10, the second protective layer 11, the first electrode layer 6 and the second electrode layer 7. Accordingly, the organic layer 9 is sealed by inorganic materials and conductive materials. Consequently, intrusion of moisture and the like into the organic layer 9 can be satisfactorily reduced. In addition, even if the seal of the organic layer is broken in a pixel, a phenomenon that moisture and the like which have intruded into the organic layer in the pixel intrude into an organic layer in an adjacent pixel can be reduced.

In addition, the first protective layer 10 and the second insulating layer 5 are disposed between the organic layer 9 and the first electrode layer 6, and the first protective layer 10 and the second insulating layer 5 are provided so as to extend to the outside of the organic layer 9. Accordingly, even if the second electrode layer 7 is formed at a position shifted from a desired position, the first electrode layer 6 is not directly contact with the second electrode layer 7. Thus, a short circuit of these layers can be reliably prevented.

The end faces of the second electrode layer 7 are also completely covered with the second protective layer 11. Accordingly, the second electrode layer 7 can also be sealed in each of the pixel regions 13 reliably.

In the case where each of the first protective layer 10 and the second protective layer 11 is made of $SiN_x$, the first protective layer 10, which is formed prior to the deposition of the organic layer 9, is preferably formed at a deposition temperature higher than the deposition temperature of the second protective layer 11, which is formed after the deposition of the organic layer 9. Herein, the term "deposition temperature" means both the temperature during the deposition and the annealing temperature after the deposition. The deposition temperature of the first protective layer 10 is, for example, in the range of 150° C. to 200° C., which is equal to or lower than the baking temperature of the first insulating layer 4, the second insulating layer 5 and the partition wall 12. The deposition temperature of the second protective layer 11 is, for example, in the range of room temperature (e.g., about 20° C.) to 100° C. at which the organic layer 9 is not decomposed.

Thus, both the first protective layer 10 and the second protective layer 11 including $SiN_x$ increase the bonding strength of a bonded surface in areas where the first protective layer 10 and the second protective layer 11 overlap with each other. Accordingly, the reliability of the seal can be increased.

Since the first protective layer 10 is formed before the deposition of the organic layer 9, the first protective layer 10 can be deposited at a temperature higher than the glass transition temperature of the organic layer 9. In this case, the deposition temperature of the first protective layer 10 can be higher than that of the second protective layer 11. As a result, the composition of the first protective layer 10 can be close to the stoichiometric composition ratio, and thus, the first protective layer 10 can be formed as a sealing film that is denser than the second protective layer 11. Herein, the term stoichiometric composition ratio means the following: For example, in the case where the protective layer is made of SiN, the composition thereof is $Si_3N_4$. Similarly, in the case where the protective layer is made of SiO, the composition thereof is $SiO_2$. If the organic layer 9 were exposed at a temperature higher than the glass transition temperature of the material constituting the organic layer 9, the organic layer 9 would be damaged. Therefore, it is not preferable that the second protective layer 11 be deposited at a temperature equal to or higher than the glass transition temperature of the material constituting the organic layer 9.

The EL device 1 in accordance with this embodiment includes the partition wall 12 that has a substantially reverse-tapered cross-sectional shape. Therefore, the organic layer 9 and the second electrode layer 7 are deposited from a direction substantially perpendicular to the substrate 2 using a part of or all of the upper surface of the partition wall 12. Thereby, the organic layer 9 and the second electrode layer 7 are not formed beneath the upper surface of the partition wall 12. As a result, the organic layer 9 and the second electrode layer 7 can be easily and separately formed in the pixel regions 13. On the other hand, the first protective layer 10 and the second protective layer 11 are formed using a deposition method (such as CVD) by which the first protective layer 10 and the second protective layer 11 are formed beneath the upper surface of the partition wall 12. Thereby, the first protective layer 10 and the second protective layer 11 reliably sandwich outer edges of the organic layer 9 and the second electrode layer 7 to seal the organic layer 9 and the second electrode layer 7. In addition, the first protective layer 10 and the second protective layer 11 can be reliably bonded to the side surfaces of the partition wall 12.

Furthermore, the entire surface of the partition wall 12 and the surface of the second insulating layer 5 located near the lower part of the partition wall 12 are covered with two layers, namely, the first protective layer 10 and the second protective layer 11. Accordingly, the reliability of the seal between the partition wall 12 and the second insulating layer 5, each of which includes a resin, can be improved.

MODIFICATIONS

Modifications of the EL device 1 according to the above embodiment is described.

Figure 4:
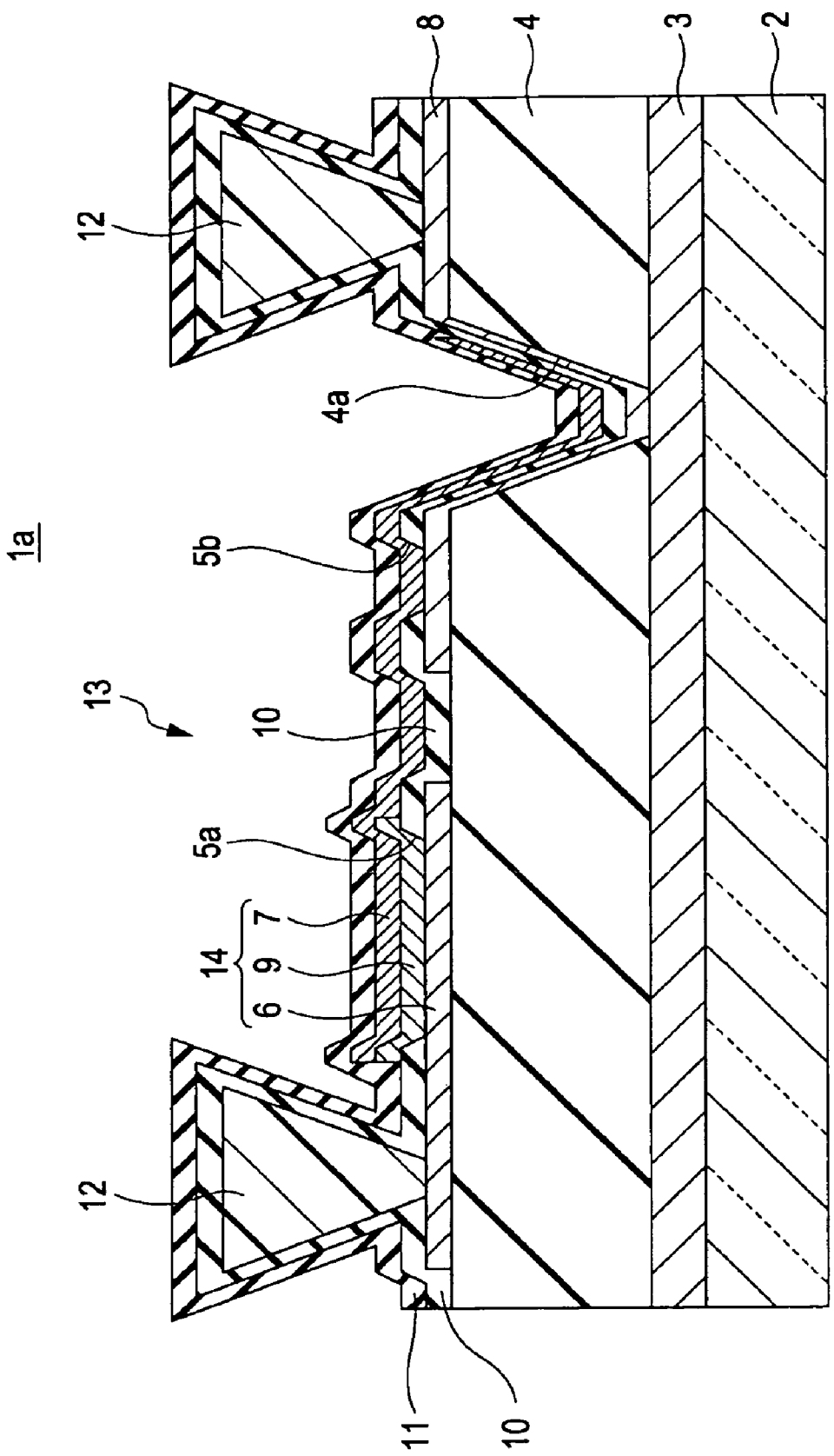
FIG. 4 is a cross-sectional view showing a modification of the EL device according to one embodiment of the present invention.

In an EL device 1a shown in FIG. 4, the second insulating layer 5 is omitted in the structure of the above-described EL device 1, and a first protective layer 10 also functions as the second insulating layer 5. Thereby, the structure of the EL device 1a is simplified. Accordingly, the first protective layer 10 is provided on the upper surface side of a substrate 2 with respect to the top surfaces of a first electrode layer 6 and a conductive layer 8. Openings 5a and 5b are provided in the first protective layer 10. A partition wall 12 is formed on the upper surface side of the substrate 2 before the organic layer 9 and the first protective layer 10 are formed.

Figure 5:
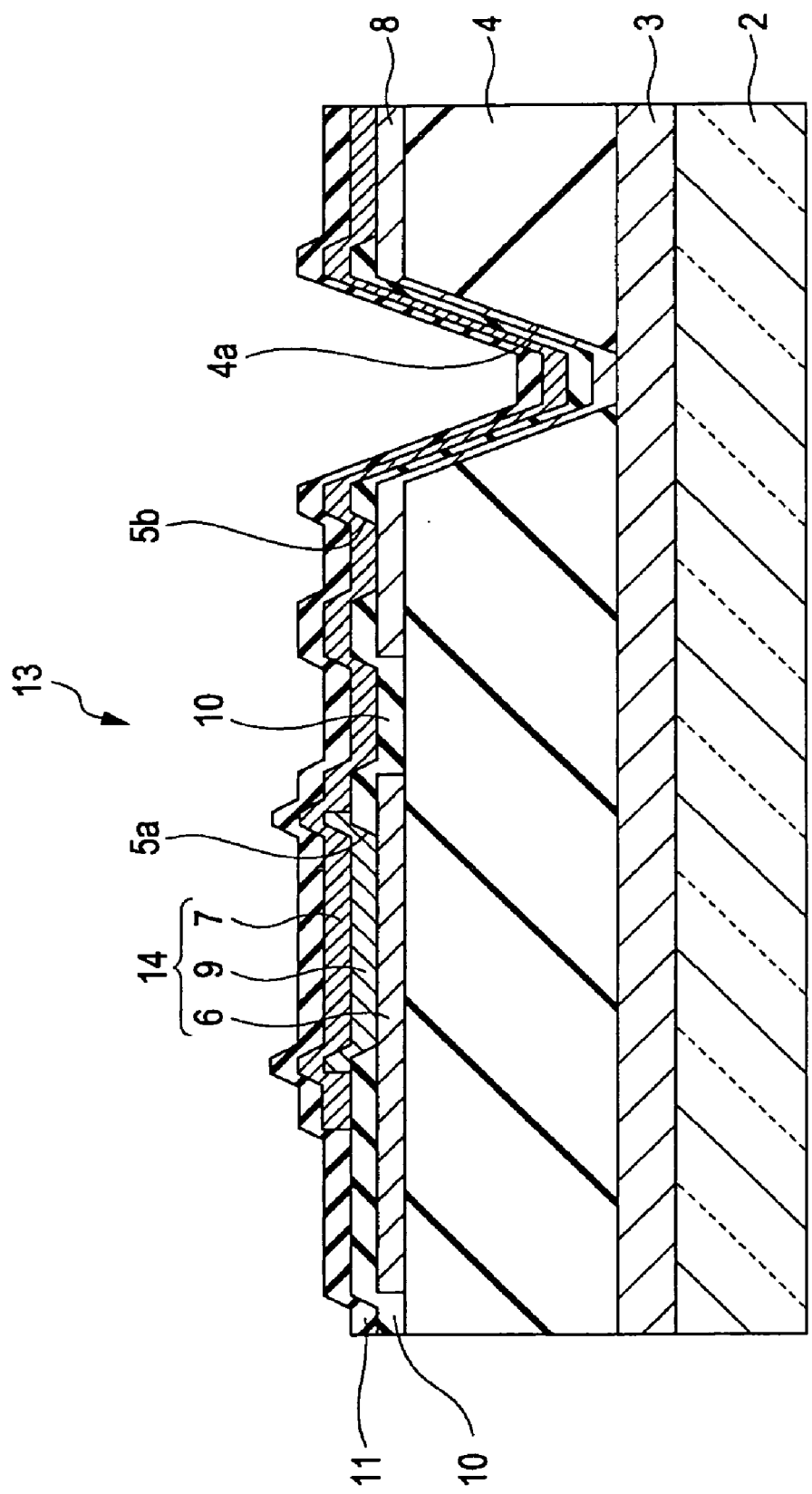
FIG. 5 is a cross-sectional view showing a modification of the EL device according to one embodiment of the present invention.

In an EL device 1b shown in FIG. 5, the partition wall 12 is omitted in the structure of the EL device 1a of the above modification, and thus, the structure can be further simplified.

In the EL devices 1a and 1b shown in FIGS. 4 and 5, respectively, a first insulating layer 4 exposed from the first electrode layer 6 and the conductive layer 8 is covered with the first protective layer 10. This structure can satisfactorily reduce the intrusion of moisture and the like from the first insulating layer 4 into the organic layer 9.

Figure 6:
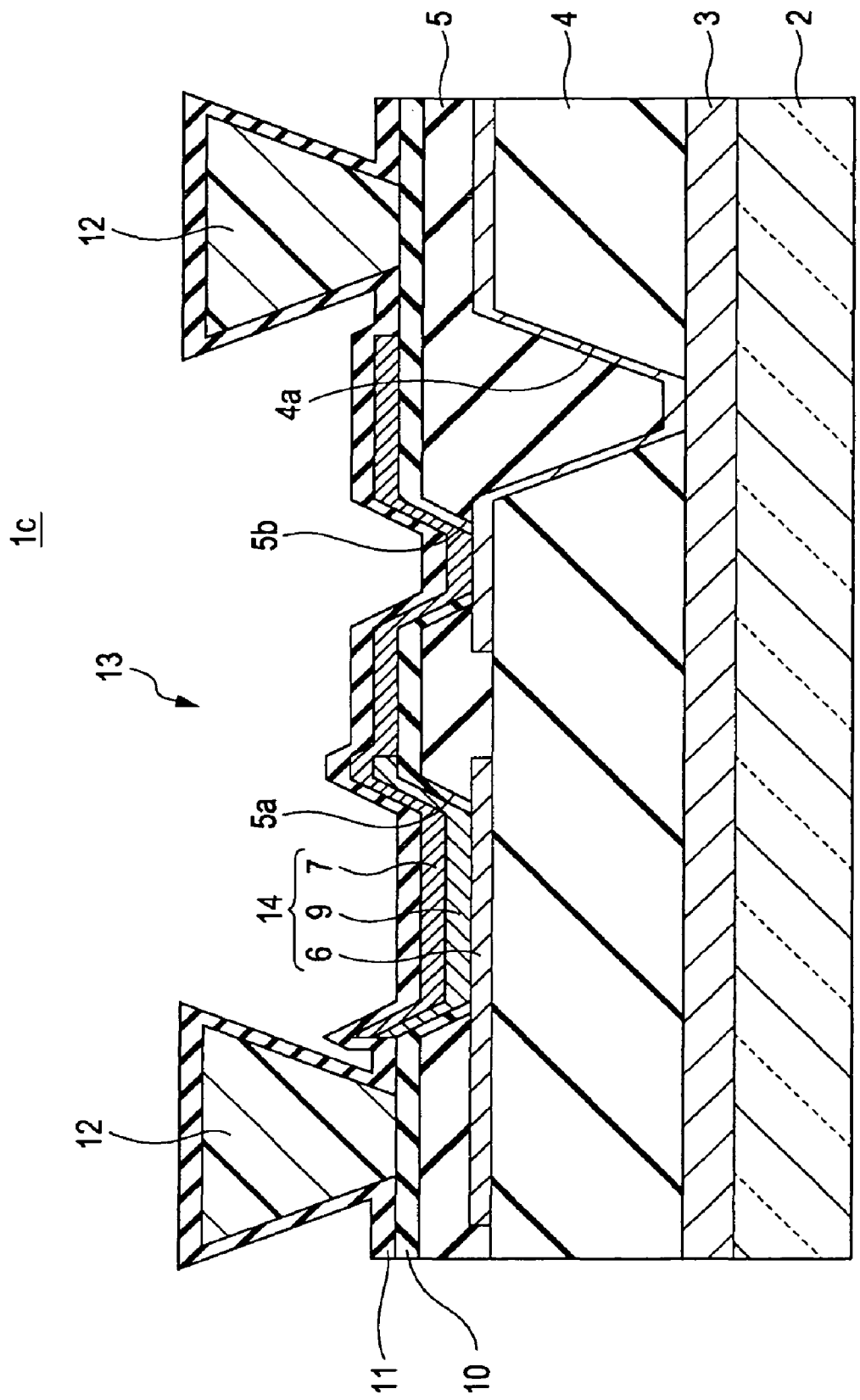
FIG. 6 is a cross-sectional view showing a modification of the EL device according to one embodiment of the present invention.

An EL device 1c shown in FIG. 6, in the structure of the above-described EL device 1, further includes the first protective layer 10 formed before the formation of the partition wall 12, and thus, the surface of the partition wall 12 is covered with a single second protective layer 11. Accordingly, the partition wall 12 is disposed on the first protective layer 10. This EL device 1c is advantageous in that the deposition temperature of the first protective layer 10 can be determined without consideration of heat resistance of the partition wall 12 because the first protective layer 10 can be formed before the formation of the partition wall 12.

Figure 7:
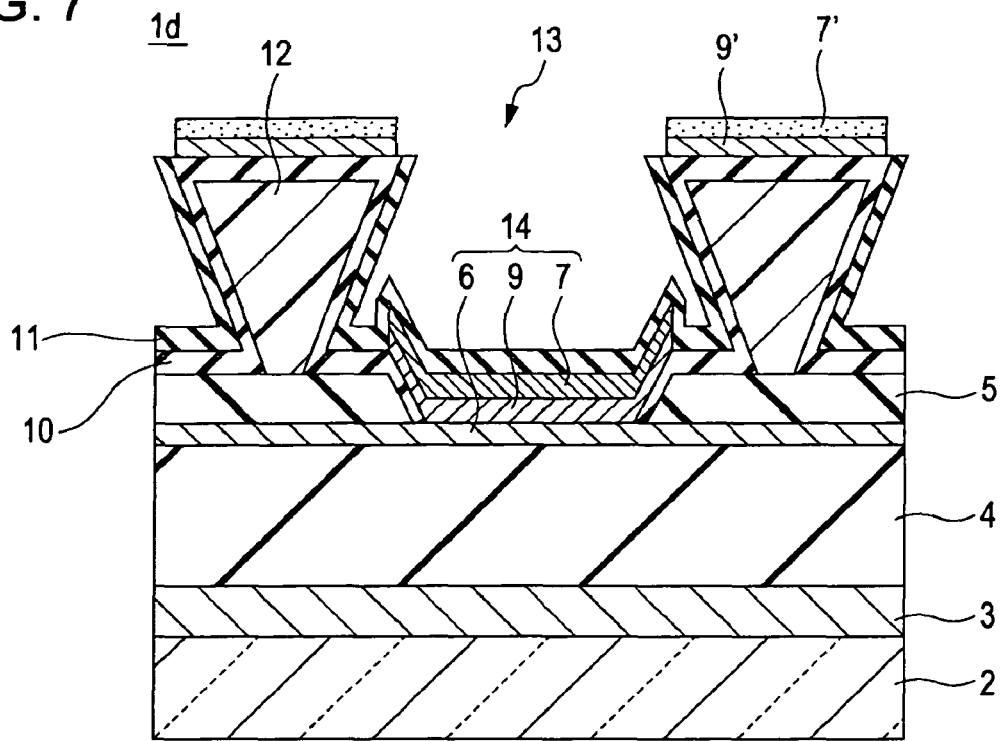
FIG. 7 is a modification of the cross-sectional view taken along line II-II of FIG. 1.

In an EL device 1d shown in FIG. 7, an organic material layer 9' and an electrode material layer 7' which include the same materials as the organic layer 9 and the second electrode layer 7, respectively, are formed on a first protective layer 10 extending to the upper surface of a partition wall 12 by, for example, an vapor deposition method using the partition wall 12 as a mask, as described above. The electrode material layer 7' is used as a moisture-absorbing layer 7' for absorbing moisture and oxygen. Therefore, moisture and oxygen around pixel regions 13 can be satisfactorily absorbed by the moisture-absorbing layer 7'.

Figure 10:
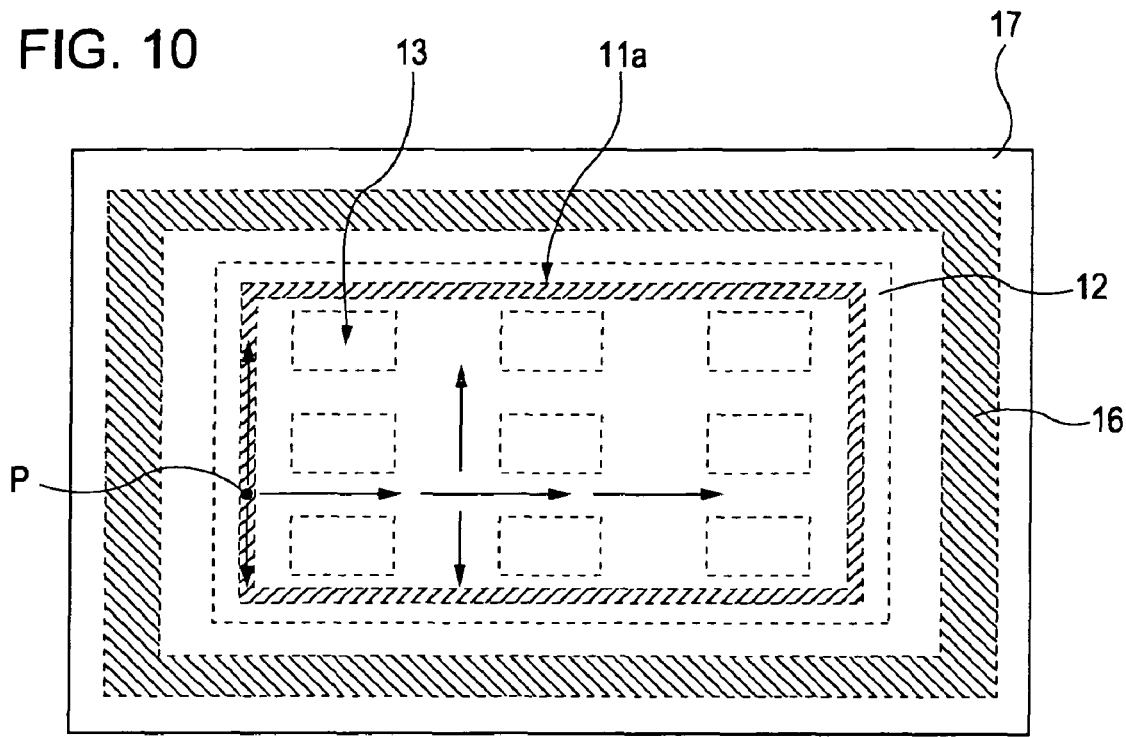
FIG. 10 is a plan view showing an example of a propagation path of moisture and oxygen.

The moisture-absorbing layer 7' is bonded on substantially the entire upper surface of the partition wall 12 formed in a grid pattern. In addition, the first protective layer 10 including an inorganic material is disposed between the moisture-absorbing layer 7' and the partition wall 12. Accordingly, moisture absorbed by the moisture-absorbing layer 7' at a certain point P does not easily intrude into the partition wall 12. As a result, as shown in FIG. 10, the moisture is transmitted along the partition wall 12. Accordingly, in this structure, moisture absorbed by the moisture-absorbing layer 7' does not easily intrude into an organic light-emitting element 14. Therefore, moisture absorbed by the moisture-absorbing layer 7' is less likely to intrude into the organic light-emitting element 14 through the partition wall 12, thus effectively protecting the organic light-emitting element 14. FIG. 10 is an upper surface perspective view of the EL device in which the second protective layer 11 is removed.

The second electrode layer 7 and the moisture-absorbing layer 7' can be formed at the same time in a single step. Thus, the production yield of the EL device can be improved by simplifying the deposition process of the EL device.

In addition, since the moisture-absorbing layer 7' is formed on the upper surface of the partition wall 12, which is disposed around the organic light-emitting element 14, light emitted from the organic light-emitting element 14 can be less shielded. Furthermore, this arrangement of the moisture-absorbing layer 7' is preferable from the standpoint that a space can be effectively utilized because the moisture-absorbing layer 7' is formed utilizing the area of the upper surface of the partition wall 12, which tends to become a dead space.

The moisture-absorbing layer 7' can be made of a material containing an alkaline earth metal, such as magnesium (Mg) or calcium (Ca), as a main component. Here, the term "main component" means a component that is contained in the material constituting the moisture-absorbing layer 7' in the largest amount.

Figure 8:
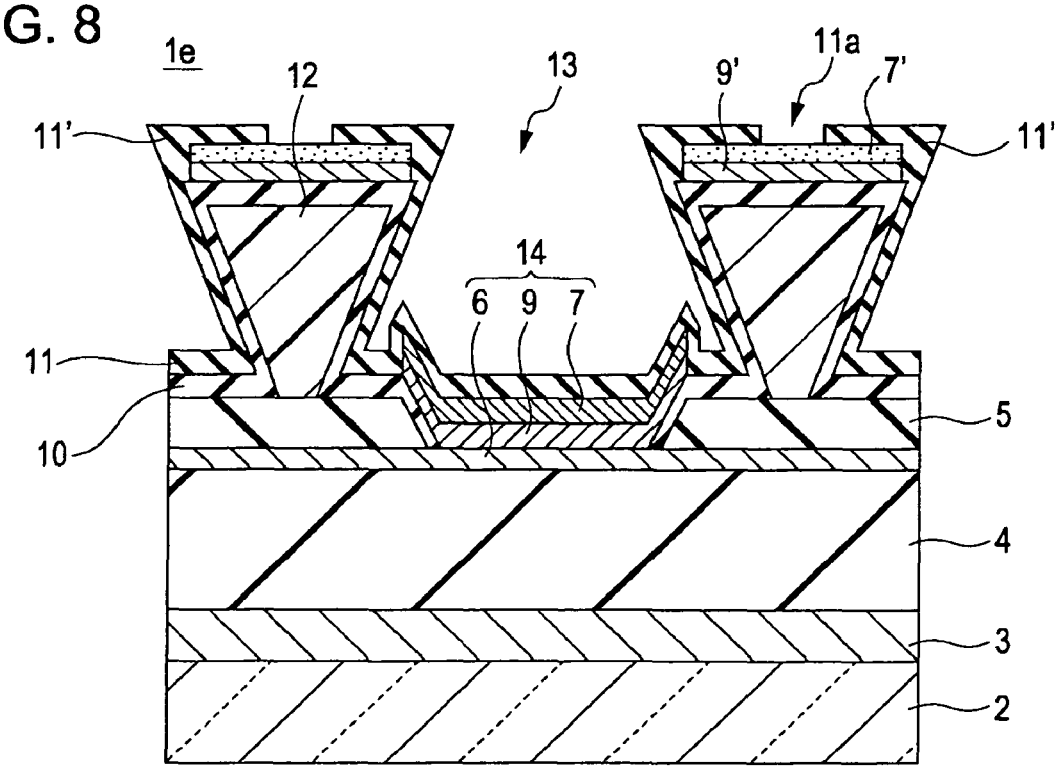
FIG. 8 is a modification of the cross-sectional view taken along line II-II of FIG. 1.

In an EL device 1e shown in FIG. 8, the above-mentioned second protective layer 11 formed on an organic light-emitting element 14 extends to the top of a partition wall 12 to form an extending portion 11'. The moisture-absorbing layer 7' is covered with the extending portion 11'. Furthermore, an opening 11a is provided in the extending portion 11' of the second protective layer 11 so as to expose a part of the moisture-absorbing layer 7'. This structure also achieves the same advantages as those of the EL device 1d shown in FIG. 9. Furthermore, since the moisture-absorbing layer 7' is covered with the extending portion 11' of the second protective layer 11, detachment of the moisture-absorbing layer 7' can be satisfactorily reduced.

The opening 11a at the center of the moisture-absorbing layer 7' enables the extending portion 11' to cover edges of the moisture-absorbing layer 7' satisfactorily, which easily become a starting point of detachment.

As shown in FIGS. 9A and 9B, the opening 11a is preferably formed in the extending portion 11' located on sides of the partition wall 12 that are closest to a sealing material 15 and along the sides of the partition walls 12. In such a case, the moisture-absorbing layer 7' that absorbs moisture and the like is provided in the area near the sealing material 15 where the concentrations of moisture and oxygen tend to be high. Accordingly, moisture and the like can be more effectively absorbed, and thus, the organic light-emitting element 14 can be effectively protected. Note that FIG. 9A is an upper surface perspective view of the EL device in which the second protective layer 11 is removed.

Even if moisture and oxygen intrude into the sealed pixel regions 13, the opening 11a can absorb the moisture and oxygen before the moisture and oxygen reach the pixel regions 13, and thus organic light-emitting elements 14 can be effectively protected. As shown in FIGS. 9A and 9B, the opening 11a along the outer periphery of the sealing substrate 17 enables moisture and oxygen to be rapidly absorbed even if outside air intrudes from any position of the sealing material 16 into the substrate. Accordingly, the organic light-emitting elements 14 can be more reliably protected.

Figure 11:
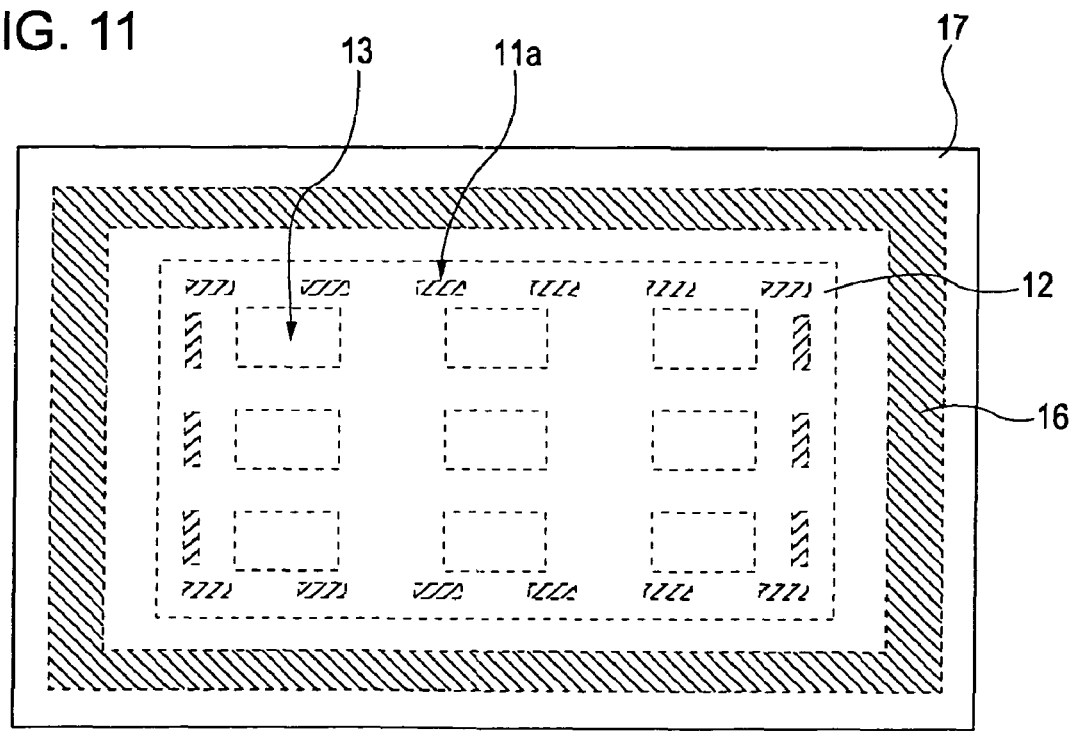
FIG. 11 is a plan view showing a modification of the EL device according to one embodiment of the present invention.

The opening 11a shown in FIGS. 9A and 9B are provided along the partition wall 12 in the form of a line, but the arrangement of the opening 11a is not limited thereto. Alternatively, as shown in FIG. 11, a plurality of openings 11a may be provided at intervals. Unlike the structure shown in FIG. 9A, the second protective layer 11 is not completely separated by the opening 11a but continuously formed. Therefore, the adhesiveness of the second protective layer 11 can be satisfactorily maintained, and thus, detachment of the second protective layer 11 can be effectively reduced. FIG. 11 is an upper surface perspective view of an EL device in which the second protective layer 11 is removed.

Such openings 11a can be formed, for example, as follows. A contact pin or the like is directly brought into contact with the extending portion 11' of the second protective layer 11 provided on the partition wall 12, thereby forming holes in a part of the extending portion 11'. Alternatively, a part of the extending portion 11' may be removed by a processing technique such as dry etching.

The present invention is not limited to the above-described embodiments. Various changes and modifications can be made without departing from the scope of the present invention.

For example, an EL device may have a structure in which each of the cross sections taken along line II-II and line III-III in FIG. 1 is the cross section shown in FIG. 3. In this case, all the end faces of the organic layer 9 and the second electrode layer 7 are covered with the second protective layer 11.

What is claimed is:
1. An EL device comprising:
   a substrate;
   a first electrode layer on the substrate;
   an insulating layer on the first electrode layer, comprising an organic material and including an opening corresponding to a pixel;
   a first protective layer covering the insulating layer;
   an organic layer on the first protective layer and the first electrode layer in the opening, including a light-emitting layer;
   a second electrode layer on the organic layer;
   a second protective layer on the second electrode layer, wherein the second protective layer covers edges of the organic layer and the second electrode layer and extends to the outside of the region where the organic layer and the second electrode layer are formed so as to contact the first protective layer;
   a plurality of pixel regions where organic light-emitting elements are arranged, each of which comprises the first electrode layer, the organic layer, and the second electrode layer; and
   a partition wall on the insulating layer, separating adjacent pixel regions, wherein an entire surface of the partition wall is covered with the first protective layer, and the second protective layer covers the first protective layer to be in direct contact with an upper surface of the first protective layer on the partition wall.

2. The EL device according to claim 1, wherein the second protective layer covers all the edges of the organic layer.

3. The EL device according to claim 1, wherein the second electrode layer covers a part of the edges of the organic layer, and the second protective layer covers all the edges of the organic layer.

4. The EL device according to claim 3, wherein the first protective layer and the second protective layer comprise the same inorganic material.

5. The EL device according to claim 4, wherein the first protective layer is denser than the second protective layer.

6. The EL device according to claim 1, wherein the deposition temperature of the first protective layer is equal to or higher than the glass transition temperature of the material constituting the organic layer, and wherein the deposition temperature of the second protective layer is equal to or lower than the glass transition temperature of the material constituting the organic layer.

7. The EL device according to claim 1,
wherein the cross section of the partition wall has a substantially reverse-tapered shape in which the upper width is larger than the lower width.

8. The EL device according to claim 1,
wherein the first protective layer extends to the upper surface of the partition wall, and
a moisture-absorbing layer comprising the same material as the second electrode layer is provided on the first protective layer on the partition wall.

9. The EL device according to claim 8, wherein the cross section of the partition wall has a substantially reverse-tapered shape in which the upper width is larger than the lower width.

10. The EL device according to claim 8, wherein the material constituting the moisture-absorbing layer contains an alkaline earth metal as a main component.

11. An EL device comprising:
a substrate;
a first electrode layer on the substrate;
a first protective layer on the first electrode layer, having an opening corresponding to a pixel;
an organic layer on the first protective layer and the first electrode layer in the opening, including a light-emitting layer;
a second electrode layer on the organic layer;
a second protective layer on the second electrode layer, wherein the second protective layer covers edges of the organic layer and the second electrode layer and extends to the outside of the region where the organic layer and the second electrode layer are formed so as to contact the first protective layer;
a plurality of pixel regions where organic light-emitting elements are arranged, each of which comprises the first electrode layer, the organic layer, and the second electrode layer; and
a partition wall on an insulating layer, separating adjacent pixel regions,
wherein an entire surface of the partition wall is covered with the first protective layer, and the second protective layer covers the first protective layer to be in direct contact with an upper surface of the first protective layer on the partition wall.

12. The EL device according to claim 11,
wherein the cross section of the partition wall has a substantially reverse-tapered shape in which the upper width is larger than the lower width.

13. The EL device according to claim 11,
wherein the first protective layer extends to the upper surface of the partition wall, and
a moisture-absorbing layer comprising the same material as the second electrode layer is provided on the first protective layer on the partition wall.

* * * * *